(12) United States Patent
Lee

(10) Patent No.: US 9,875,800 B2
(45) Date of Patent: Jan. 23, 2018

(54) 3D NAND SEMICONDUCTOR DEVICE FOR ERASING GROUPS OF BIT LINES

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/691,827

(22) Filed: Apr. 21, 2015

(65) Prior Publication Data

US 2016/0141043 A1 May 19, 2016

(30) Foreign Application Priority Data

Nov. 19, 2014 (KR) .......................... 10-2014-0161654

(51) Int. Cl.
*G11C 16/16* (2006.01)
*G11C 7/18* (2006.01)
*G11C 16/08* (2006.01)
*G11C 16/04* (2006.01)

(52) U.S. Cl.
CPC ............... *G11C 16/16* (2013.01); *G11C 7/18* (2013.01); *G11C 16/08* (2013.01); *G11C 16/0483* (2013.01)

(58) Field of Classification Search
CPC ........... G11C 16/16; G11C 7/18; G11C 16/08; G11C 16/0483; H01L 27/115
See application file for complete search history.

(56) References Cited

U.S. PATENT DOCUMENTS

| 2011/0194357 | A1* | 8/2011 | Han | G11C 16/16 365/185.29 |
| 2013/0279256 | A1* | 10/2013 | Costa | G11C 5/02 365/185.17 |
| 2014/0043915 | A1* | 2/2014 | Choi | G11C 16/10 365/185.25 |
| 2014/0192594 | A1* | 7/2014 | Lue | G11C 16/10 365/185.11 |
| 2014/0369123 | A1* | 12/2014 | Costa | G11C 16/0408 365/185.11 |
| 2016/0005468 | A1* | 1/2016 | Lee | G11C 16/06 365/185.11 |

FOREIGN PATENT DOCUMENTS

| KR | 1020120034828 A | 4/2012 |
| KR | 1020120058380 A | 6/2012 |
| KR | 1020140028732 A | 3/2014 |

* cited by examiner

*Primary Examiner* — Han Yang
*Assistant Examiner* — Jerome Leboeuf
(74) *Attorney, Agent, or Firm* — William Park & Associates Ltd.

(57) ABSTRACT

A semiconductor device may include a memory block including memory strings connected to respective bit lines coupled to a substrate and commonly connected to a common source line coupled to the substrate. The semiconductor device may include an operation circuit configured to perform an operation on memory cells included in the memory strings. The bit lines may be classified into a plurality of groups. The operation circuit may be configured to apply a voltage to bit lines of a selected group and set the common source line to a voltage level for the operation.

17 Claims, 11 Drawing Sheets

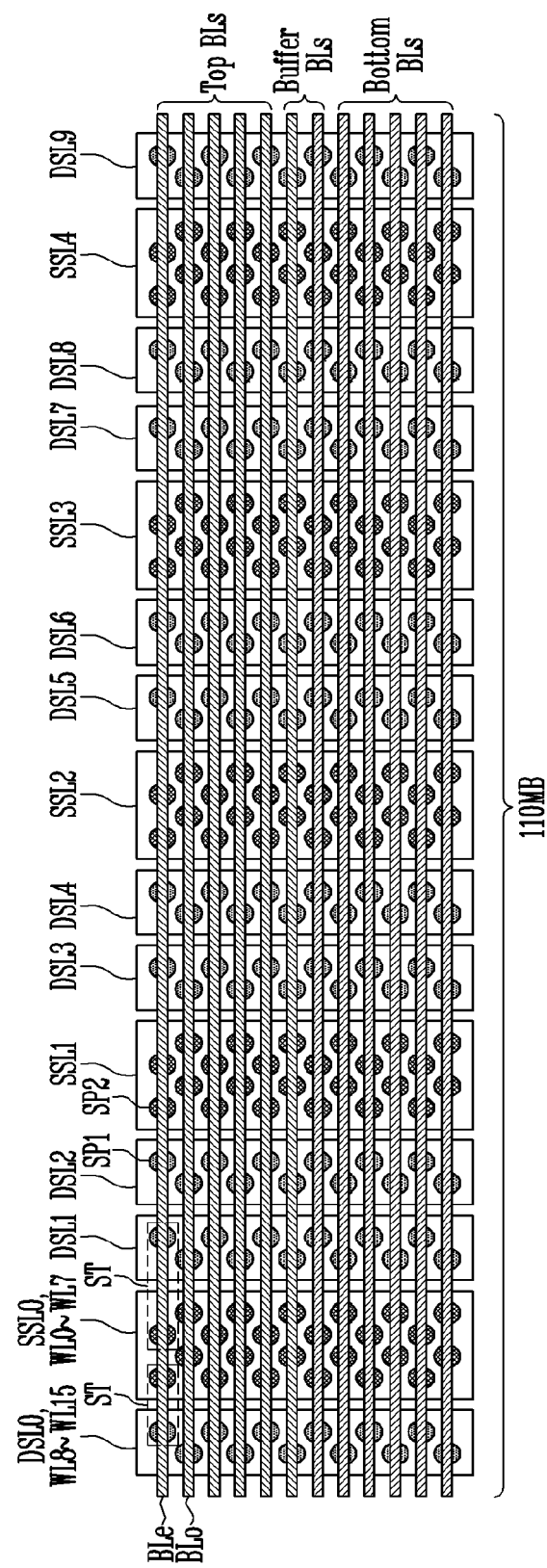

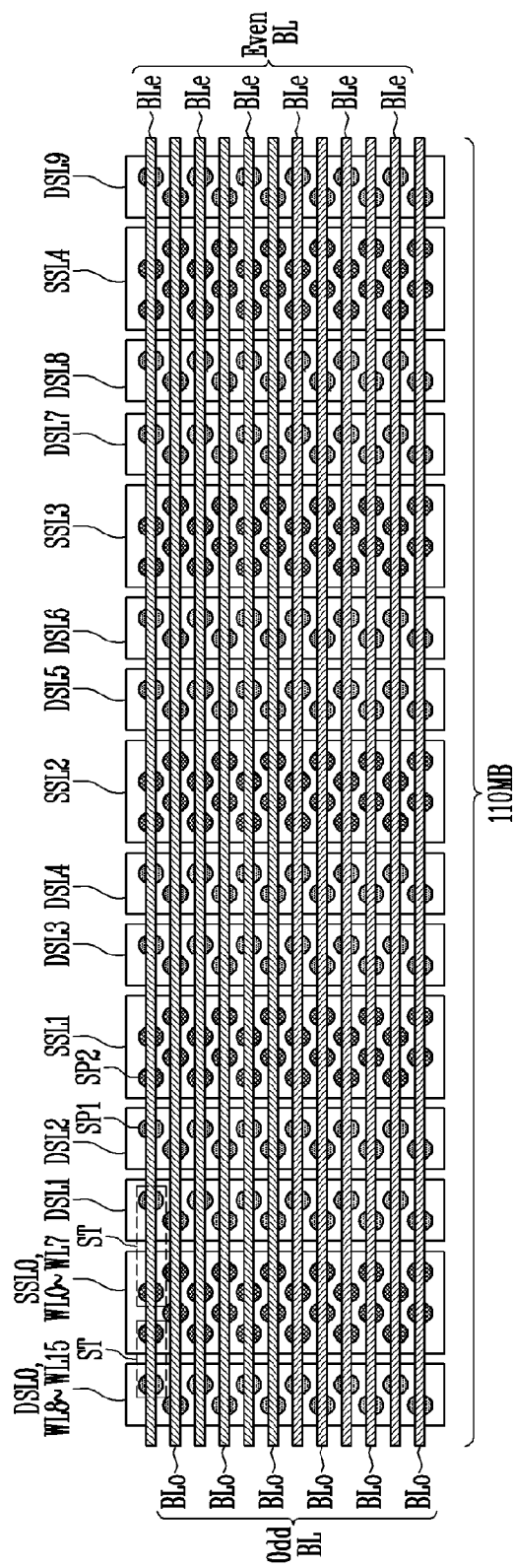

3D NAND SEMICONDUCTOR DEVICE FOR ERASING GROUPS OF BIT LINES

CROSS-REFERENCE TO RELATED APPLICATION

The present application claims priority to Korean patent application number 10-2014-0161654 filed on Nov. 19, 2014, in the Korean Intellectual Property Office, the entire disclosure of which is incorporated by reference herein.

BACKGROUND

1. Technical Field

Various embodiments generally relate to a semiconductor device, and more particularly, to a semiconductor device including a memory cell.

2. Related Art

A program operation is performed to store data in a memory cell. An erase operation is performed to erase the data stored in the memory cell. The program operation is performed on a page basis. The erase operation is performed on a memory block basis.

As the number of memory cells included in a memory array increases, the size of the memory block, including the memory cells, increases. For this reason, too many memory cells are erased in the erase operation.

SUMMARY

In an embodiment, a semiconductor device may include a memory block, the memory block may include memory strings connected to respective bit lines coupled to a substrate and commonly connected to a common source line coupled to the substrate. The semiconductor device may include an operation circuit configured to perform an operation on memory cells included in the memory string. The bit lines may be classified into a plurality of groups. The operation circuit may be configured to apply a voltage to bit lines of a selected group and set the common source line to a voltage level for the operation.

In an embodiment, a semiconductor device may include a memory block, the memory block may include memory strings substantially perpendicularly connected to a substrate between a bit line and a common source line coupled to the substrate. The memory string may include a drain select transistor, memory cells, and a source select transistor connected between the bit line and the common source line. The semiconductor device may include an operation circuit configured to perform an erase operation on the memory cells. A pair of adjacent memory strings connected to each other by gates of the source select transistors may be classified into one group. The operation circuit may be configured to perform an erase operation on memory cells included in memory strings of a selected group.

In an embodiment, a semiconductor device may include a memory block, the memory block may include memory strings substantially perpendicularly connected to a substrate between bit lines and a common source line coupled to the substrate. The memory string may include a drain select transistor, memory cells, and a source select transistor connected between the bit line and the common source line. The semiconductor device may include an operation circuit configured to perform an erase operation on the memory cells. The memory strings connected to different bit lines and sharing gates of drain select transistors may be classified into one group. The operation circuit may be configured to perform an erase operation on memory cells included in memory strings of a selected group.

BRIEF DESCRIPTION OF THE DRAWINGS

FIGS. 3 to 8 are views illustrating representations of examples of an operating method of a semiconductor device according to various embodiments.

DETAILED DESCRIPTION

Hereinafter, various examples of embodiments will now be described below with reference to the accompanying drawings. The embodiments may, however, be embodied in many different forms and should not be construed as being limited to the embodiments set forth herein. Rather, these embodiments are provided so that this disclosure will be through and complete, and will fully convey the concepts disclosed herein.

The various embodiments may change the fundamental basis of the erase operation in order to improve the lifetime and electric characteristics of the semiconductor device.

Figure 1:
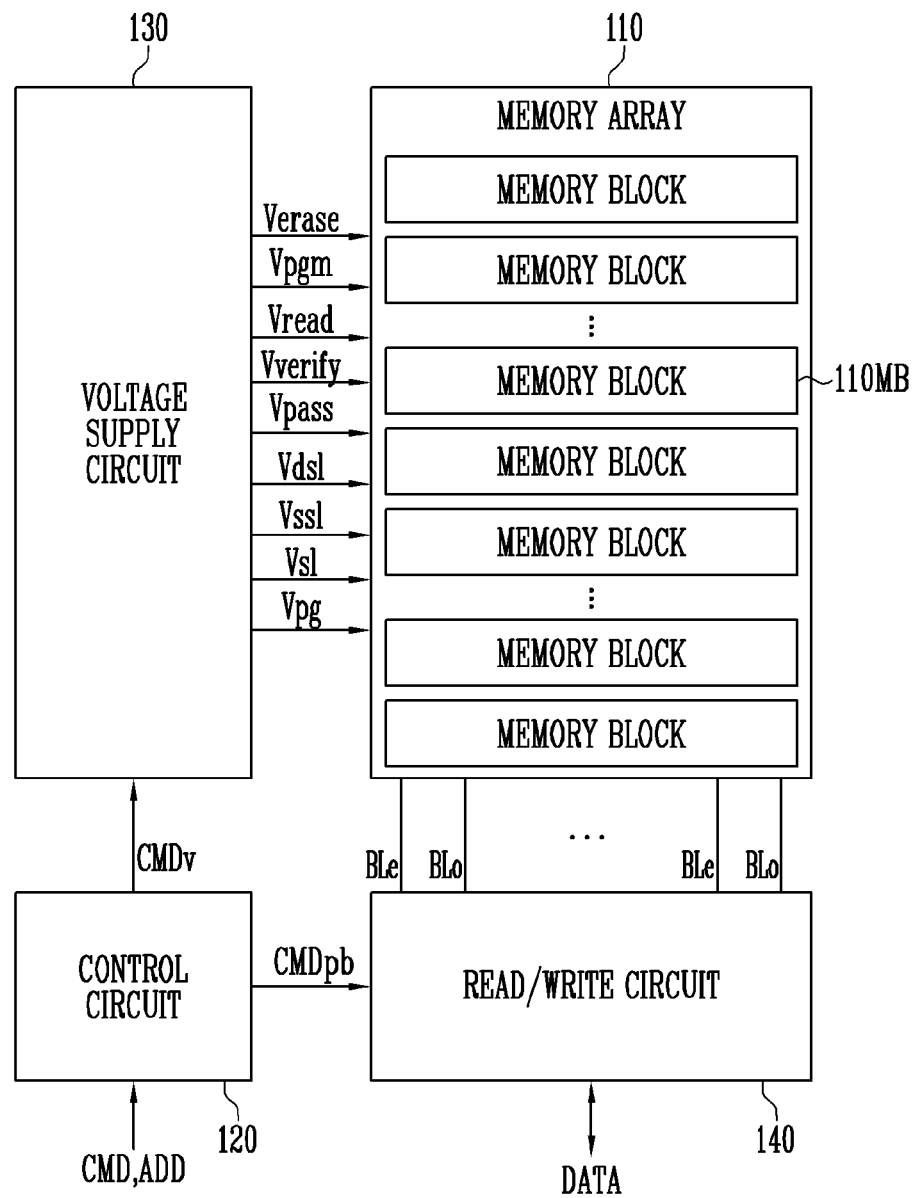
FIG. 1 is a block diagram illustrating a representation of an example of a semiconductor device according to an embodiment.

FIG. 1 is a block diagram illustrating a representation of an example of a semiconductor device according to an embodiment.

Referring to FIG. 1, the semiconductor device may include a memory device 100. The memory device 100 includes a memory array 110 and operation circuits 120 to 140. The memory array 110 includes a plurality of memory blocks 110MB. Each of the memory blocks includes a plurality of memory strings. Each of the memory strings includes a plurality of memory cells. In a flash memory device, the memory block may include a flash memory cell. For example, the memory block may include flash memory cells which include floating gates formed of polysilicon or charge trap layers formed of nitride.

The memory block may include U-shaped memory strings that are each connected to bit lines and connected to a common source line in parallel. A structure of the memory block will be explained hereinafter as well.

FIGS. 2A to 2D are views illustrating representations of examples of a memory block according to an embodiment.

Figure 2A:
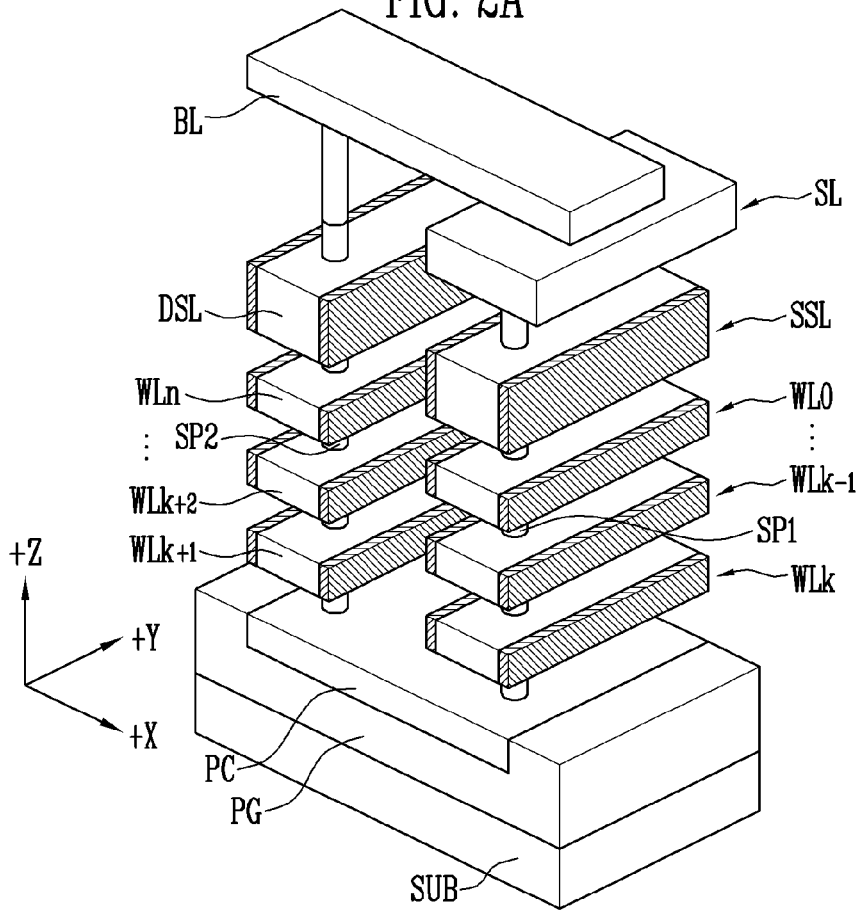
FIGS. 2A to 2D are views illustrating representations of examples of a memory block according to an embodiment.
Figure 2B:
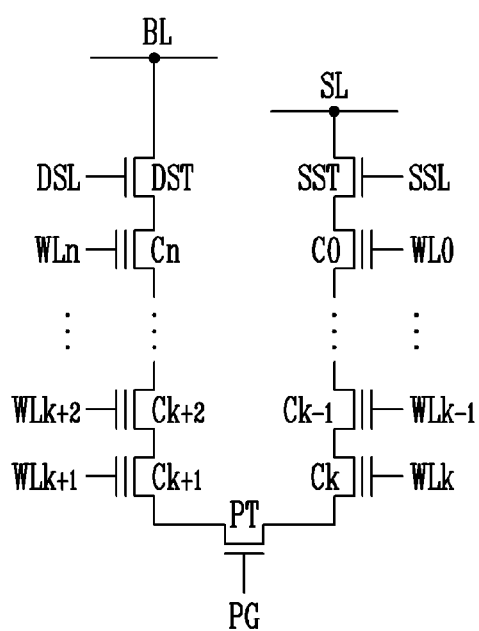

Referring to FIGS. 2A and 2B, a pipe gate PG including a recessed part is formed on a semiconductor substrate SUB. A pipe channel layer PC is formed in the recessed part of the pipe gate PG. A plurality of vertical channel layers SP1 and SP2 are formed on the pipe channel layer PC. An upper portion of the first vertical channel layer SP1 among the pair of the vertical channel layers SP1 and SP2 is connected to a common source line SL. An upper portion of the second vertical channel layer SP2 is connected to a bit line BL. The vertical channel layers SP1 and SP2 may be formed of, for example but not limited to, polysilicon.

A plurality of conductive layers DSL and WLn to WLk+1 are formed to surround the second vertical channel layer SP2 at different heights of the second vertical channel layer SP2. A plurality of conductive layers SSL and WL0 to WLk are formed to surround the first vertical channel layer SP1 at different heights of the first vertical channel layer SP1. A multi-layered layer (not illustrated) including a charge trap layer is formed on a surface of the vertical channel layers SP1 and SP2 and a surface of the pipe channel layer PC. A multi-layered layer is also interposed between the vertical channel layers SP1 and SP2 and the conductive layers DSL, WLn to WLk+1, SSL, and WL0 to WLk and between the pipe channel layer PC and the pipe gate PG.

The uppermost conductive layer which surrounds the second vertical channel layer SP2 may serve as a drain select line DSL. The conductive layers under the drain select line DSL may serve as word lines WLn to WLk+1. The uppermost conductive layer surrounding the first vertical channel layer SP1 may serve as a source select line SSL. The conductive layers under the source select line SSL may serve as word lines WL0 to WLk. Some of the conductive layers used as the word lines may serve as dummy word lines (not illustrated).

The first conductive layers SSL and WL0 to WLk and the second conductive layers DSL and WLn to WLk+1 are each stacked on different areas of the semiconductor substrate. The first vertical channel layer SP1 passing through the first conductive layers SSL and WL0 to WLk is vertically connected between the common source line SL and the pipe channel layer PC. The second vertical channel layer SP2 passing through the second conductive layers DSL and WLn to WLk+1 is vertically connected between the bit line BL and the pipe channel layer PC.

A drain select transistor DST is formed at a portion where the drain select line DSL surrounds the second vertical channel layer SP2. Main cell transistors Cn to Ck+1 are each formed at portions where the word lines WLn to WLk+1 surround the second vertical channel layer SP2. A source select transistor SST is formed at a portion where the source select line SSL surrounds the first vertical channel layer SP1. The main cell transistors C0 to Ck are each formed at portions where the word lines WL0 to WLk surround the first vertical channel layer SP1.

In an embodiment, the memory string ST may include the drain select transistor DST and the main cell transistors Cn to Ck+1, which are vertically connected between the bit line BL and the pipe channel layer PC, and the source select transistor SST and the main cell transistors C0 to Ck, which are vertically connected between the common source line SL and the pipe channel layer PC. In an embodiment, a dummy cell transistor (not illustrated) may be further connected between the select transistor DST (or SST) and the main cell transistor Cn (or C0). In an embodiment, a dummy cell transistor (not illustrated) may be connected between the main cell transistor Ck+1 or Ck and the pipe transistor PT.

The source select transistor SST and the main cell transistors C0 to Ck, which are connected between the common source line SL and the pipe transistor PT, may be included in a first vertical memory string. The drain select transistor DST and the main cell transistors Cn to Ck+1, which are connected between the bit line BL and the pipe transistor PT, may be included in a second vertical memory string.

Figure 2C:
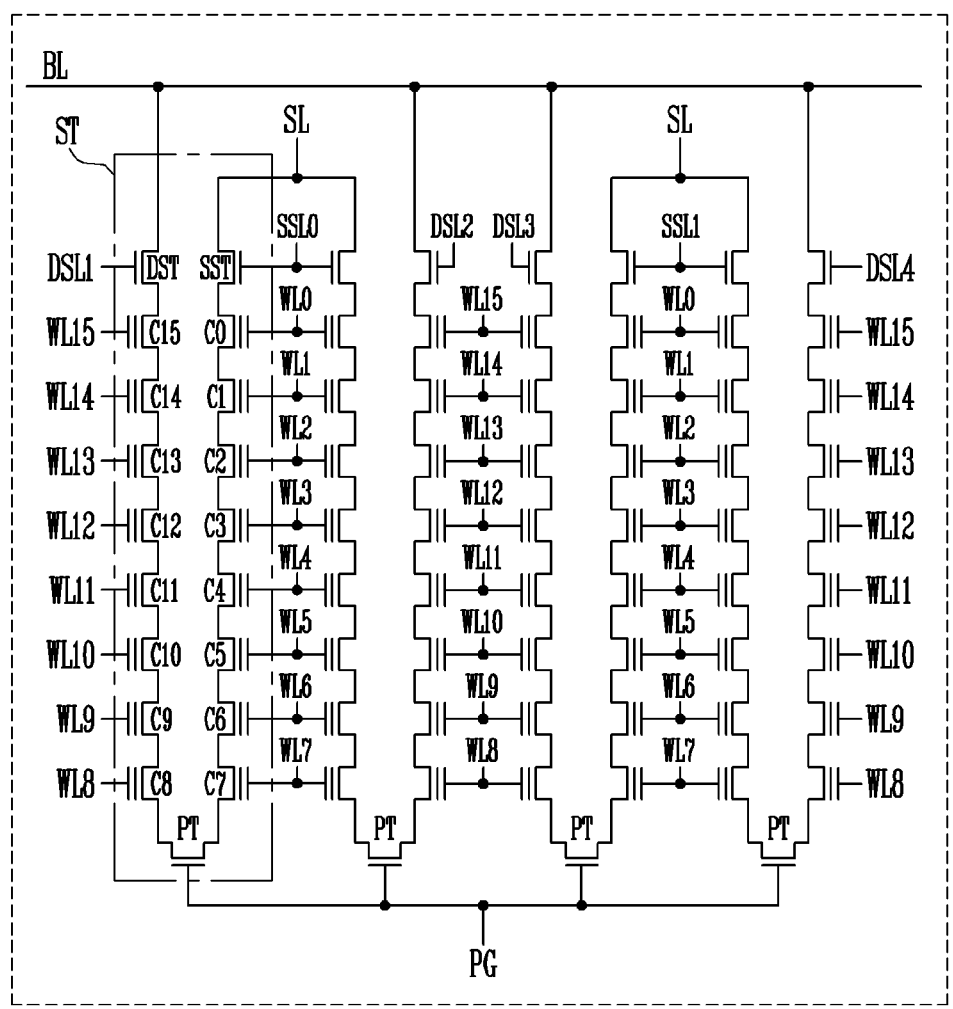

Referring to FIG. 2C, the memory block 110MB (see FIG. 1) includes a plurality of memory strings ST connected to bit lines. In a P-BiCS structure, each of the memory strings ST includes a first vertical memory string comprising SST and C0 to C7 vertically connected between the common source line SL and the pipe transistor PT of a substrate. In a P-BiCS structure, each of the memory strings ST includes a second vertical memory string comprising C8 to C15 and DST vertically connected between the bit line BL and the pipe transistor PT of the substrate. The first vertical memory string SST and C0 to C7 includes a source select transistor SST and memory cells C0 to C7. The source select transistor SST is controlled by a voltage applied to the source select lines SSL0 and SSL1, respectively. The memory cells C0 to C7 are controlled by voltages applied to the stacked word lines WL0 to WL7, respectively. The second vertical memory string C8 to C15 and DST includes a drain select transistor DST, and memory cells C8 to C15. The drain select transistor DST is controlled by a voltage applied to the drain select lines DSL1 to DSL4, respectively. The memory cells C8 to C15 are controlled by voltages applied to the stacked word lines WL8 to WL15, respectively.

When the memory block 110MB is selected, the pipe transistor PT connected between a pair of memory cells C7 and C8 disposed at a center of the memory string in the P-BiCs structure performs an operation to electrically connect the channel layers of the first vertical memory string SST and C0 to C7 included in the selected memory block 110MB to the channel layers of the second vertical memory string C8 to C15 and DST.

In a memory block with a 2-dimensional structure, one memory string is connected to every bit line and the drain select transistors of the memory block are simultaneously controlled by one drain select line. However, in the memory block 110MB with the 3-dimensional structure, a plurality of the memory strings ST are commonly connected to each bit line BL. In the same memory block 110MB, the number of memory strings ST that are commonly connected to one bit line BL and controlled by the same word lines may be changed based on a design.

As the plurality of memory strings are connected to one bit line BL in parallel, the drain select transistors DST are independently controlled by select voltages applied to the drain select lines DSL1 to DSL4 so as to selectively connect one bit line BL to the memory strings ST.

The memory cells C0 to C7 of the first vertical memory string SST and C0 to C7, and the memory cells C8 to C15 of the second vertical memory string C8 to C15 and DST, which are vertically connected in the memory block 110MB, are each controlled by operating voltages applied to the stacked word lines WL0 to WL7 and the stacked word lines WL8 to WL15. These word lines WL0 to WL15 are classified in memory block units.

The select lines DSL1 to DSL4, SSL0, and SSL1 and the word lines WL0 to WL15 serve as the local lines of the memory block 110MB. The source select lines SSL0 and SSL1 and the word lines WL0 to WL7 may serve as local lines of the first vertical memory string, and the drain select lines DSL1 to DSL4 and the word lines WL8 to WL15 may serve as local lines of the second vertical memory string. Gates PG of the pipe transistors PT may be commonly connected in the memory block 110MB.

Figure 2D:
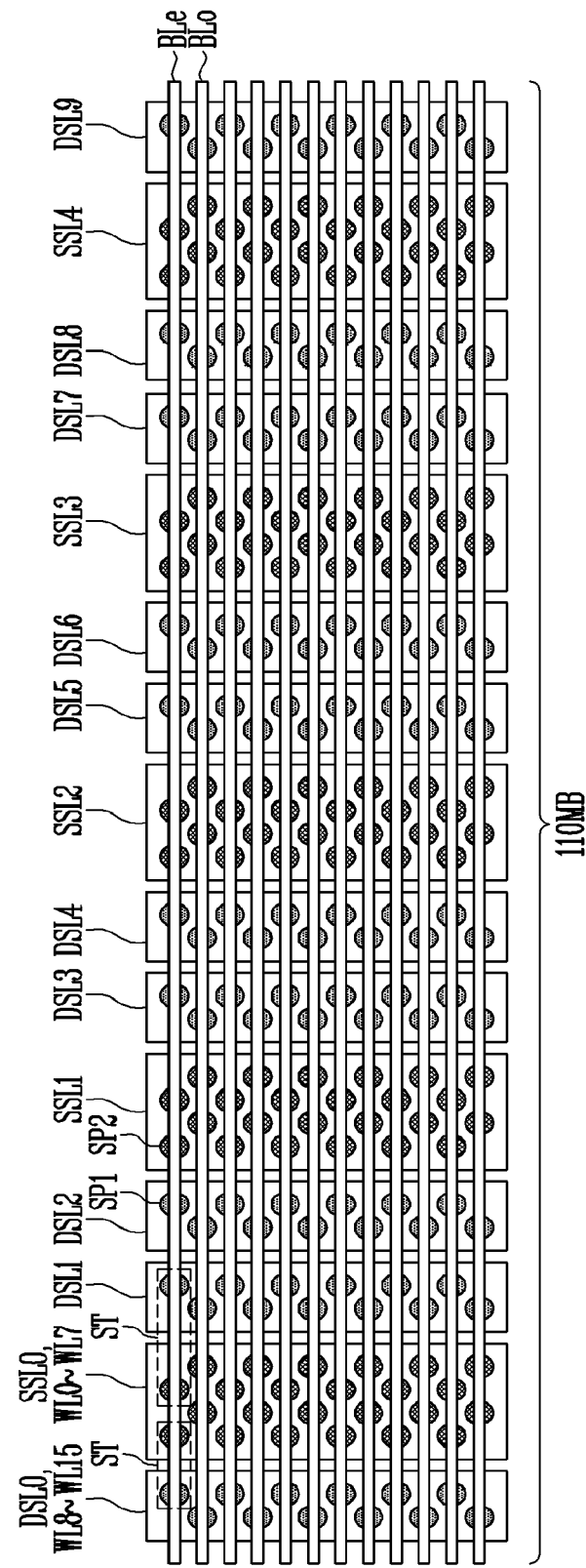

Referring to FIG. 2D, the vertical channel layers SP2 and SP1 may be arranged in a zigzag shape. Upper portions of the vertical channel layers SP2 may be connected to bit lines BLe and BLo. Upper portions of the vertical channel layers SP1 may be connected to the common source line (not illustrated).

In the memory block 110MB, the drain select lines DSL0 to DSL9 in the memory strings ST connected to the same bit line BLe may be separated from each other. Some of the memory strings ST connected to different bit lines BLe and BLo may share the drain select line DSL0. A pair of adjacent memory strings ST may share the common source line SSL0.

According to an embodiment, when ten memory strings are connected to the bit line BLe in the memory block 110MB, ten drain select lines DSL0 to DSL9 and five source select lines SSL0 to SSL4 may be formed. Two drain select lines DSL1 and DSL2 may be interposed between the source select lines SSL0 and SSL1. The select lines DSL0 to DSL9 and SSL0 to SSL4 may be arranged in a direction crossing the bit lines BLe and BLo.

Referring to FIGS. 1 and 2B, the operation circuits 120 to 140 are configured to perform a program loop, an erase loop, and a read operation of memory cells (for example, C0) connected to the selected word line (for example, WL0). The program loop includes a program operation and a verification operation, and the erase loop includes an erase operation and a verification operation. The operation circuits 120 to 140 may perform a program operation (or a post-program operation) configured to adjust an erase level based on distribution of threshold voltages of the memory cells after the erase loop.

In order to perform the program loop, the erase loop, and the read operation, the operation circuits 120 to 140 are configured to selectively output the operating voltages to the local lines SSL, WL0 to WLn, PG, and DSL and the common source line SL of the selected memory block, and control precharge/discharge of the bit lines BL or sense a current flow (or a voltage variation) of the bit lines BL.

In a NAND flash memory device, the operation circuits include a control circuit 120, a voltage supply circuit 130, and a read/write circuit 140. The control circuit 120, the voltage supply circuit 130, and the read/write circuit 140 will be described below.

The control circuit 120 controls the voltage supply circuit 130 to generate operating voltages Verase, Vpgm, Vread, Vverify, Vpass, Vdsl, Vssl, Vsl, and Vpg for performing the program loop, the erase loop, and the read operation in response to a command signal input from the outside, at desired levels and to apply the operating voltages to the local lines SSL, WL0 to WLn, PG, and DSL and the common source line SL of the selected memory block. For this control, the control circuit 120 may output a voltage control signal CMDv to the voltage supply circuit 130. The control circuit 120 controls the read/write circuit 140 to control precharge/discharge of the bit lines BL based on data to be stored in the memory cells to perform the program loop, the erase loop, and the read operation. The control circuit 120 controls the read/write circuit 140 to control precharge/discharge of the bit lines BL based on data to be stored in the memory cells to sense a current flow (or a voltage variation) of the bit lines BL during the read operation or verification operation. For this control, the control circuit 120 may output an operation control signal CMDpb to the read/write circuit 140.

The voltage supply circuit 130 generates the operating voltages Verase, Vpgm, Vread, Vverify, Vpass, Vdsl, Vssl, Vsl, and Vpg required in the program loop, the erase loop, and the read operation of the memory cells based on the control signal CMDv of the control circuit 120. The operating voltages may include an erase voltage Verase, a program voltage Vpgm, a read voltage Vread, a verify voltage Vverify, a pass voltage Vpass, select voltages Vdsl and Vssl, a common source voltage Vsl, a pipe gate voltage Vpg, and/or the like. The voltage supply circuit 130 outputs the operating voltages to the local lines SSL, WL0 to WLn, PG, and DSL and the common source line SL of the selected memory block in response to a row address signal (not illustrated) of the control circuit 120.

The read/write circuit 140 may include a plurality of page buffers (not illustrated) connected to the memory array 110 through the respective bit lines BL (i.e., BLo, BLe). The page buffers may be connected to the respective bit lines BL. One page buffer may be connected to one bit line. In the program operation, the page buffers selectively precharge the bit lines BL based on the control signal CMDpb of the control circuit 120 and data DATA to be stored in the memory cells. In the program verification operation or the read operation, based on the control signal CMDpb of the control circuit 120, the read/write circuit 140 may precharge the bit lines BL, and then sense the voltage variation or a current of the bit lines BL and latch data read from the memory cell.

The operation circuits 120 to 140 including the above-mentioned elements may be configured to perform the erase operation on a smaller basis rather than on the memory block basis.

A method of operating the semiconductor device including the above-mentioned structures and embodiments will be explained. FIGS. 3 to 8 are views illustrating representations of examples of an operating method of a semiconductor device according to various embodiments.

Referring to FIGS. 1 and 3, the bit lines BLe and BLo may be classified into a plurality of bit line groups Top BLs and Bottom BLs. The operation circuits 120 to 140 may perform the erase operation on the memory strings in a bit line group (for example, Top BLs and Bottom BLs) basis rather than on the memory block 110MB basis. When the operation circuits 120 to 140 perform the erase operation on the memory strings connected to bit lines of the selected group (for example, Top BLs), the operation circuits 120 to 140 may inhibit the erase operation of the memory strings connected to bit lines of the non-selected group (for example, Bottom BLs).

In order to perform the erase operation on the bit line group basis, the operation circuits 120 to 140 may apply voltages required in the erase operation to the bit lines Top BLs, Bottom BLs, and Buffer BLs, the common source line SL (i.e., see FIGS. 2A-2C), and the local lines SSL0 to SSL4, WL0 to WL15, DSL0 to DSL9, and PG (i.e., see FIGS. 2A-2C), as in the following Table 1.

TABLE 1

|  | Erase of memory strings connected to Top BLs | Erase of memory strings connected to Bottom BLs |
| --- | --- | --- |
| SL | Floating | Floating |
| SSL0 to SSL4 | Floating | Floating |
| WL0 to WL15 | 0 V | 0 V |
| PG | Floating or Vpg | Floating or Vpg |
| DSL0 to DSL9 | Vdsl (Generation of GIDL current) | Vdsl (Generation of GIDL current) |
| Top BLs | Verase | Verase_inhibit |
| Buffer BLs | Floating or Vbl_buffer | Floating or Vbl_buffer |
| Bottom BLs | Verase_inhibit | Verase |

For example, for the erase operation, the operation circuits 120 to 140 may apply the erase voltage Verase to the first group of bit lines Top BLs, and an erase inhibit voltage Verase_inhibit to the second group of bit lines Bottom BLs. The erase voltage Verase may be applied to the first group of bit lines Top BLs in a range between 0 V and 25 V. The erase inhibit voltage Verase_inhibit may be applied to the second group of bit lines Bottom BLs in a range between 5 V and 10 V. The erase inhibit voltage Verase_inhibit may improve the erase disturbance characteristics of the memory strings connected to the second group of bit lines Bottom BLs.

The bit lines may be classified into the plurality of groups Top BLs and Bottom BLs based on the arranged order, and the operation circuits 120 to 140 may apply the erase inhibit voltage Verase_inhibit, lower than the erase voltage Verase, to bit lines Bottom BLs of the non-selected group.

The operation circuits 120 to 140 may set buffer bit lines Buffer BLs interposed between the bit line groups to a floating state, or apply a positive voltage Vbl_buffer of about 10 V, lower than the erase voltage, to the buffer bit lines Buffer BLs when performing the erase operation. Through these operations, the breakdown characteristics among the bit line groups may be improved.

In the erase operation, the operation circuits 120 to 140 may set the common source line SL and the source select lines SSL0 to SSL4 to a floating state. Through these operations, the source select transistor may be prevented from being erased.

The operation circuits 120 to 140 may apply a positive drain select voltage Vdsl to the drain select lines DSL0 to DSL9 so that a gate-induced drain leakage (GIDL) current required in the erase operation may be generated in the drain select transistor. The drain select voltage Vdsl may be lower than the erase voltage Verase by about 8 V.

In the erase operation, the operation circuits 120 to 140 set the pipe transistor of the memory string formed on the substrate to an erase inhibit state. In order to set the pipe transistor, the operation circuits 120 to 140 may apply a positive voltage Vpg of about 10 V to the gate PG of the pipe transistor, or set the pipe transistor to a floating state.

When the operation circuits 120 to 140 perform the erase operation on the memory strings connected to the second group of bit lines Bottom BLs, the operation circuits 120 to 140 may apply the erase voltage Verase to the second group of bit lines Bottom BLs, and the erase inhibit voltage Verase_inhibit to the first group of bit lines Top BLs.

Referring to FIGS. 1 and 4, the bit lines may be classified into the first group including even bit lines BLe and the second group including odd bit lines BLo. The operation circuits 120 to 140 may be configured to apply the erase voltage Verase to bit lines of the selected group, and to apply the erase inhibit voltage Verase_inhibit lower than the erase voltage Verase to bit lines of the non-selected group, or set bit lines of the non-selected group to a floating state.

When the bit lines are classified into the even bit lines BLe and the odd bit lines BLo, the operation circuits 120 to 140 may apply voltages required in the erase operation to the bit lines BLe and BLo, the common source line SL (i.e., see FIGS. 2A-2C), and the local lines SSL0 to SSL4, WL0 to WL15, DSL0 to DSL9, and PG (i.e., see FIGS. 2A-2C), as in the following Table 2.

TABLE 2

|  | Erase of memory strings connected to BLe | Erase of memory strings connected to BLo |
| --- | --- | --- |
| SL | Floating | Floating |
| SSL0 to SSL4 | Floating | Floating |
| WL0 to WL15 | 0 V | 0 V |
| PG | Floating or Vpg | Floating or Vpg |

TABLE 2-continued

|  | Erase of memory strings connected to BLe | Erase of memory strings connected to BLo |
| --- | --- | --- |
| DSL0 to DSL9 | Vdsl (Generation of GIDL current) | Vdsl (Generation of GIDL current) |
| BLe | Verase | Verase_inhibit |
| BLo | Verase_inhibit | Verase |

For example, for the erase operation, when the operation circuits 120 to 140 perform the erase operation on the memory strings connected to the even bit lines BLe, the operation circuits 120 to 140 may apply the erase voltage Verase to the first group of bit lines BLe, and the erase inhibit voltage Verase_inhibit to the second group of bit lines BLo. For the erase operation, when the operation circuits 120 to 140 perform the erase operation on the memory strings connected to the odd bit lines BLo, the operation circuits 120 to 140 may apply the erase voltage Verase to the second group of bit lines BLo, and the erase inhibit voltage Verase_inhibit to the first group of bit lines BLe. The erase voltage Verase may be applied to the first group of bit lines BLe in a range between 0 V and 25 V. The erase inhibit voltage Verase_inhibit may be applied to bit lines BLo of the second group in a range between 5 V and 10 V.

Voltages described above with regards to FIG. 3 may be applied to the common source line SL and the local lines SSL0 to SSL4, WL0 to WL15, DSL0 to DSL9, and PG in the same way with regards to FIG. 4.

Figure 5:
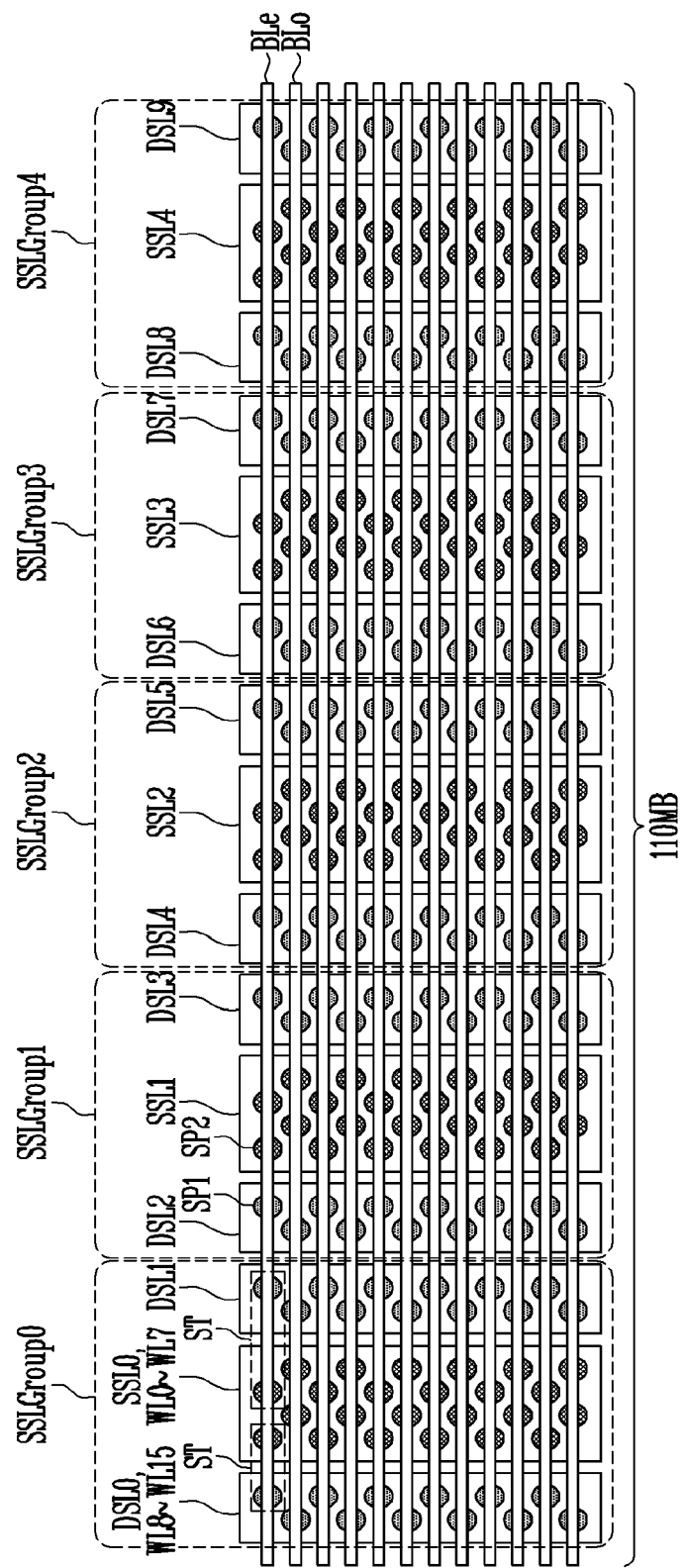

Referring to FIGS. 1 and 5, a pair of adjacent memory strings, of which the gates of the source select transistors are connected to each other, may be defined as a unit group. The memory strings sharing the source select lines SSL0 to SSL4 may be classified into a unit memory string group. The operation circuits 120 to 140 may selectively perform the erase operation on the memory cells included in memory strings of the selected group.

The operation circuits 120 to 140 may apply voltages required in the erase operation to the bit lines BL, the common source line SL (i.e., see FIGS. 2A-2C), and the local lines SSL0 to SSL4, WL0 to WL15, DSL0 to DSL9, and PG (i.e., see FIGS. 2A-2C), for the erase operation of the selected group, as in the following Table 3.

TABLE 3

|  | Partial erase condition |
| --- | --- |
| SL | Verase |
| Selected SSL | Vssl_sel (Generation of GIDL current) |
| Unselected SSLs | Floating or Vssl_unsel |
| WL0 to WL15 | 0 V |
| PG | Floating or Vpg |
| DSL with selected SSL | Vdsl_sel (Generation of GIDL current) |
| DSLs with unselected SSL | Vdsl_unsel |
| BL | Floating or Verase |

For example, for the erase operation, the operation circuits 120 to 140 may be configured to apply the erase voltage Verase to the common source line SL, and to set the bit lines BL to a floating state or apply the erase voltage Verase to the bit lines BL. The operation circuits 120 to 140 may apply the ground voltage (for example, 0 V) to the word lines WL0 to WL15, and set the gate PG of the pipe transistor to a floating state or apply the positive voltage Vpg of about 10 V, which is capable of inhibiting the erase, to the gate PG of the pipe transistor.

For the erase operation of the memory strings included in the selected group, the operation circuits 120 to 140 may apply the positive source select voltage Vssl_sel to the source select line SSL0, corresponding to the gates of the source select transistors in the selected group (for example, SSLGroup0). The source select voltage Vssl_sel may be applied so that the GIDL current required in the erase operation may be generated in the source select transistor, and the source select voltage Vssl_sel may be lower than the erase voltage Verase by about 8 V.

The operation circuits 120 to 140 may set the source select lines SSL1 to SSL4, corresponding to the gates of the source select transistors in the non-selected groups SSLGroup1 to SSLGroup4, to a floating state, or apply the positive source select voltage Vssl_unsel to the source select lines SSL1 to SSL4 to prevent the erase of the source select transistors in the non-selected groups SSLGroup1 to SSLGroup4. When the positive source select voltage Vssl_unsel is applied to the source select lines SSL1 to SSL4, the erase potential may be transferred less to the channel area of the non-selected memory strings, improving the erase disturbance characteristics. The source select voltage Vssl_unsel may be lower than the source select voltage Vssl_sel.

For the erase operation of the memory strings included in the selected group, the operation circuits 120 to 140 may apply the same positive drain select voltage Vdsl_sel as the source select voltage Vssl_sel to the drain select lines DSL0 and DSL1, corresponding to the gates of the drain select transistors in the selected group (for example, SSLGroup0). The drain select voltage Vdsl_sel may be applied so that the GIDL current required in the erase operation may be generated in the drain select transistor, and the drain select voltage Vdsl_sel may be lower than the erase voltage Verase by about 8 V.

The operation circuits 120 to 140 may set the drain select lines DSL2 to DSL9, corresponding to the gates of the drain select transistors in the non-selected groups SSLGroup1 to SSLGroup4, to a floating state, or apply the same positive drain select voltage Vdsl_unsel as the source select voltage Vssl_unsel to the drain select lines DSL2 to DSL9 to prevent the erase of the drain select transistors in the non-selected groups SSLGroup1 to SSLGroup4. When the positive drain select voltage Vdsl_unsel is applied to the drain select lines DSL2 to DSL9, the erase potential may be transferred less from the bit lines BL to the channel area of the non-selected memory strings, improving the erase disturbance characteristics. The drain select voltage Vdsl_unsel may be lower than the drain select voltage Vdsl_sel.

Figure 6:
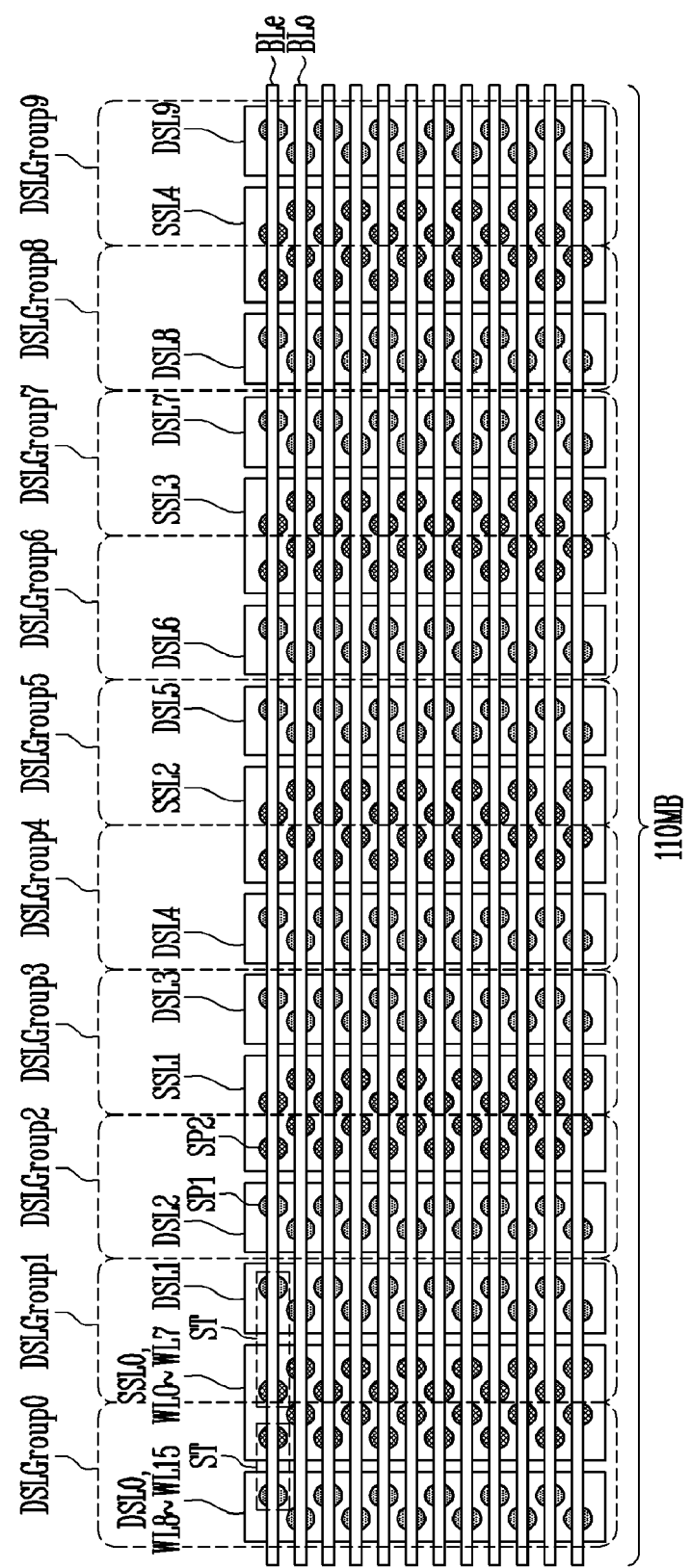

Referring to FIGS. 1 and 6, the memory strings connected to different bit lines and sharing drain select lines, which correspond to the gates of the drain select transistors, may be defined as a unit group. The memory strings sharing the respective drain select lines DSL0 to DSL9 may be classified into a unit memory string group. The operation circuits 120 to 140 may selectively perform the erase operation on the memory cells included in memory strings of the selected group.

The operation circuits 120 to 140 may apply voltages required in the erase operation to the bit lines BL, the common source line SL (i.e., see FIGS. 2A-2C), and the local lines SSL0 to SSL4, WL0 to WL15, DSL0 to DSL9, and PG (i.e., see FIGS. 2A-2C), for the erase operation of the selected group, as in the following Table 4.

TABLE 4

| | Partial erase condition |
|---|---|
| SL | Floating |
| SSL | Floating |
| WL0 to WL15 | 0 V |
| PG | Floating or Vpg |
| Selected DSL | Vdsl_sel |
| | (Generation of GIDL current) |
| Unselected DSLs | Floating or Vdsl_unsel |
| BL | Verase |

For example, the operation circuits 120 to 140 may be configured to apply the erase voltage Verase to the bit line BL, and set the common source line SL to a floating state for the erase operation. The operation circuits 120 to 140 may apply the ground voltage (for example, 0 V) to the word lines WL0 to WL15, and set the gate PG of the pipe transistor to a floating state or apply the positive voltage Vpg of about 10 V, capable of inhibiting the erase, to the gate PG of the pipe transistor.

For the erase operation of the memory strings included in the selected group (for example, DSLGroup0), the operation circuits 120 to 140 may apply the positive drain select voltage Vdsl_sel to the drain select line DSL0, corresponding to the gates of the drain select transistors in the selected group DSLGroup0. The drain select voltage Vdsl_sel may be applied so that the GIDL current required in the erase operation may be generated in the drain select transistor, and the drain select voltage Vdsl_sel may be lower than the erase voltage Verase by about 8 V. The operation circuits 120 to 140 may set the source select line SSL0, corresponding to the gates of the source select transistors in the selected group DSLGroup0, to a floating state.

The operation circuits 120 to 140 may set the drain select lines DSL1 to DSL9, corresponding to the gates of the drain select transistors in the non-selected groups DSLGroup1 to DSLGroup9, to a floating state, or apply the positive drain select voltage Vdsl_unsel to the drain select lines DSL1 to DSL9 to prevent the erase of the drain select transistors in the non-selected groups DSLGroup1 to DSLGroup9. The operation circuits 120 to 140 may set the source select lines SSL1 to SSL4, corresponding to the gates of the source select transistors in the non-selected groups DSLGroup1 to DSLGroup9, to a floating state.

When the positive drain select voltage Vdsl_unsel is applied to the drain select lines DSL1 to DSL9, the erase potential may be transferred less to the channel area of the non-selected memory strings, improving the erase disturbance characteristics. The drain select voltage Vdsl_unsel may be lower than the drain select voltage Vdsl_sel.

Figure 7:
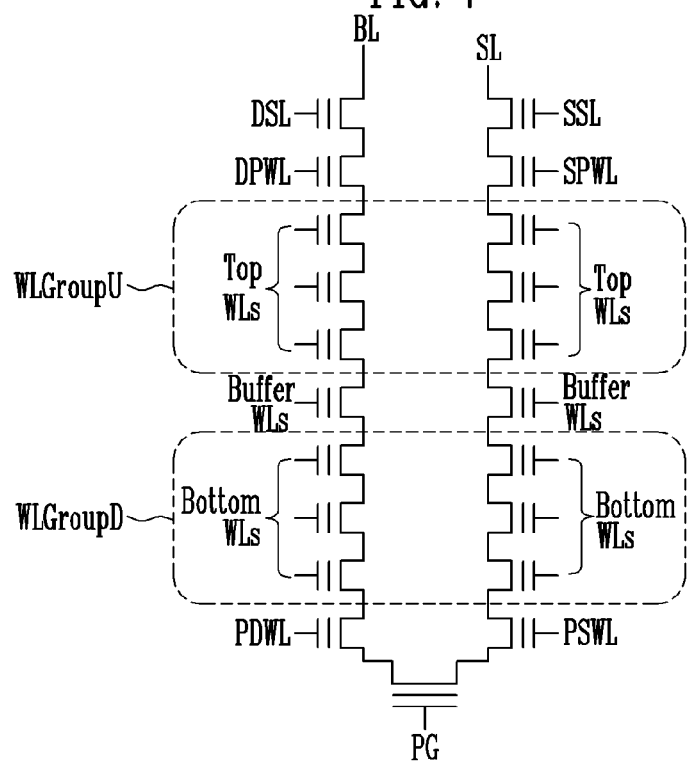

Referring to FIGS. 1 and 7, the memory cells included in the memory block may be classified into a plurality of groups WLGroupD and WLGroupU based on the height of the elements stacked on the substrate. For example, the memory cells connected to the word lines Bottom WLs, disposed in a lower portion among the word lines stacked on the substrate, may be the first group. For example, the memory cells connected to the word lines Top WLs, disposed in an upper portion among the word lines, may be the second group. The word line interposed between the word line groups WLGroupD and WLGroupU may be used as the buffer word line Buffer WLs. The dummy cells connected to the dummy word lines DPWL and SPWL may be connected between the select transistors connected to the select lines DSL and SSL, and the memory cells in the upper word line group WLGroupU. The dummy cells connected to the dummy word lines PDWL and PSWL may be connected between the pipe transistor and the memory cells in the lower word line group WLGoupD.

In order to perform the erase operation on the memory cells connected to word lines of the selected group, the operation circuits 120 to 140 may apply voltages required in the erase operation to the bit lines BL, the common source line SL, and the local lines SSL, DPWL, SPWL, Top WLs, Buffer WLs, Bottom WLs, PDWL, PSWL, DSL, and PG, as in the following Table 5.

TABLE 5

|  | Erase of memory cells included in WLGroupU | Erase of memory cells included in WLGroupD |
|---|---|---|
| SL | Verase | Verase |
| SSL | Vssl (Generation of GIDL current) | Vssl (Generation of GIDL current) |
| SPWL & DPWL | 0 V | Floating or Verase_inhibit |
| Top WLs | 0 V | Floating or Verase_inhibit |
| Buffer WLs | Floating or Verase_inhibit | Floating or Verase_inhibit |
| Bottom WLs | Floating or Verase_inhibit | 0 V |
| PWSL & PDWL | Floating or Verase_inhibit | 0 V |
| PG | Floating or Vpg | Floating or Vpg |
| DSL | Vdsl (Generation of GIDL current) | Vdsl (Generation of GIDL current) |
| BL | Floating or Verase | Floating or Verase |

For example, for the erase operation, the operation circuits 120 to 140 may be configured to apply the erase voltage Verase to the common source line SL, and set the bit lines BL to a floating state or apply the erase voltage Verase to the bit lines BL. The operation circuits 120 to 140 may set the gate PG of the pipe transistor to a floating state or apply the positive voltage Vpg of about 10 V, which is capable of inhibiting the erase, to the gate PG of the pipe transistor, and set the buffer word line Buffer WLs to a floating state or apply the erase inhibit voltage Verase_inhibit of about 10 V, which is lower than the erase voltage, to the buffer word line Buffer WLs. The operation circuits 120 to 140 may apply positive select voltages Vssl and Vdsl lower than the erase voltage Verase by about 8 V to the select lines SSL and DSL so that the GIDL current required in the erase operation may be generated in the select transistor.

When the operation circuits 120 to 140 perform the erase operation on the memory cells connected to the word lines Top WLs in the upper word line group WLGroupU, the operation circuits 120 to 140 may apply the ground voltage (for example, 0 V) to the upper dummy word lines DPWL and SPWL and the upper word lines Top WLs. The operation circuits 120 to 140 may set the lower dummy word lines PDWL and PSWL and the lower word lines Bottom WLs to a floating state, or apply the erase inhibit voltage Verase_inhibit of about 10 V, which is lower than the erase voltage Verase, to the lower dummy word lines PDWL and PSWL and the lower word lines Bottom WLs.

For example, when the operation circuits 120 to 140 perform the erase operation on the memory cells connected to the word lines Bottom WLs in the lower word line group WLGroupD, the operation circuits 120 to 140 may apply the ground voltage (for example, 0 V) to the lower dummy word lines PDWL and PSWL and the lower word lines Bottom WLs. The operation circuits 120 to 140 may set the upper dummy word lines DPWL and SPWL and the upper word lines Top WLs to a floating state, or apply the erase inhibit voltage Verase_inhibit of about 10 V, which is lower than the erase voltage Verase, to the upper dummy word lines DPWL and SPWL and the upper word lines Top WLs.

Figure 8:
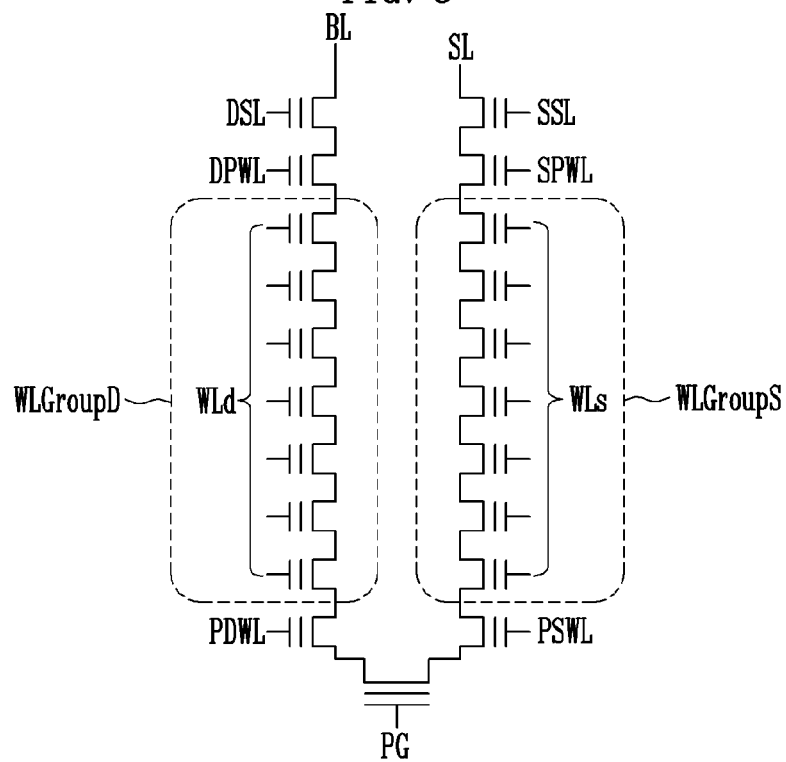

Referring to FIGS. 1 and 8, the memory cells stacked on the substrate may be classified into a plurality of groups WLGroupD and WLGroupS based on the positions of the memory cells. For example, the memory cells connected to the word lines WLd, disposed between the drain select line DSL and the substrate, may be the first group WLGroupD. For example, the memory cells connected to the word lines WLs, disposed between the source select line SSL and the substrate, may be the second group WLGroupS.

The dummy cell connected to the dummy word line DPWL may be connected between the select transistor, which is connected to the drain select line DSL, and the memory cells in the word line group WLd. The dummy cell connected to the dummy word line SPWL may be connected between the select transistor, which is connected to the source select line SSL, and the memory cells in the word line group WLs.

The dummy cell connected to the dummy word lines PDWL may be connected between the pipe transistor, which is connected to the pipe gate line PG, and the memory cells in the word line group WLd. The dummy cell connected to the dummy word line PSWL may be connected between the pipe transistor, which is connected to the pipe gate line PG, and the memory cells in the word line group WLs.

In order to perform the erase operation on the memory cells connected to word lines of the selected group, the operation circuits 120 to 140 may apply voltages required in the erase operation to the bit line BL, the common source line SL, and the local lines SSL, DPWL, SPWL, WLs, WLd, PDWL, PSWL, DSL, and PG, as in the following Table 6.

TABLE 6

|  | First embodiment | | Second embodiment | |
|---|---|---|---|---|
|  | Erase of memory cells included in WLGroupS | Erase of memory cells included in WLGroupD | Erase of memory cells included in WLGroupS | Erase of memory cells included in WLGroupD |
| SL | Verase | Verase | Verase | Verase |
| SSL | Vssl (Generation of GIDL current) | Vssl (Generation of GIDL current) | Vssl (Generation of GIDL current) | Vssl (Improvement of erase disturbance) |
| SPWL | 0 V | Floating or Verase_inhibit | 0 V | Floating or Verase_inhibit |

TABLE 6-continued

| | First embodiment | | Second embodiment | |
| --- | --- | --- | --- | --- |
| | Erase of memory cells included in WLGroupS | Erase of memory cells included in WLGroupD | Erase of memory cells included in WLGroupS | Erase of memory cells included in WLGroupD |
| WLs | 0 V | Floating or Verase_inhibit | 0 V | Floating or Verase_inhibit |
| PSWL | 0 V or Floating | Floating or Verase_inhibit | 0 V or Floating | Floating or Verase_inhibit |
| PG | Floating or Verase_inhibit | Floating or Verase_inhibit | Vpg (OFF) | Vpg (OFF) |
| PDWL | Floating or Verase_inhibit | 0 V or Floating | Floating or Verase_inhibit | 0 V or Floating |
| WLd | Floating or Verase_inhibit | 0 V | Floating or Verase_inhibit | 0 V |
| DPWL | Floating or Verase_inhibit | 0 V | Floating or Verase_inhibit | 0 V |
| DSL | Vdsl (Improvement of erase disturbance) | Vdsl (Improvement of erase disturbance) | Vdsl (Improvement of erase disturbance) | Vdsl (Generation of GIDL current) |
| BL | Verase | Verase | Verase | Verase |

For example, in an embodiment, the operation circuits 120 to 140 may apply the erase voltage Verase to the common source line SL and the bit line BL, and apply the positive source select voltage Vssl lower than the erase voltage Verase by about 8 V to the source select line SSL so that the GIDL current required in the erase operation may be generated in the source select transistor, for the erase operation. The positive drain select voltage Vdsl lower than the erase voltage Verase by about 5 V may be applied to the drain select line DSL, to improve the erase disturbance characteristics. The pipe gate PG of the pipe transistor may be set to a floating state, or the erase inhibit voltage Verase_inhibit may be applied to the pipe gate PG.

In an embodiment, when the operation circuits 120 to 140 perform the erase operation on the memory cells included in group WLGroupS, the operation circuits 120 to 140 may apply the ground voltage (for example, 0 V) for the erase to the dummy word lines SPWL and PSWL and the word lines WLs. The dummy word line PSWL may be set to a floating state. The operation circuits 120 to 140 may set the dummy word lines DPWL and PDWL and the word lines WLd to a floating state, or apply the erase inhibit voltage Verase_inhibit to the dummy word lines DPWL and PDWL and the word lines WLd.

In an embodiment, when the operation circuits 120 to 140 perform the erase operation on the memory cells included in group WLGroupD, the operation circuits 120 to 140 may apply the ground voltage (for example, 0 V) for the erase to the dummy word lines DPWL and PDWL and the word lines WLd. The dummy word line PDWL may be set to a floating state. The operation circuits 120 to 140 may set the dummy word lines SPWL and PSWL and the word lines WLs to a floating state, or apply the erase inhibit voltage Verase_inhibit to the dummy word lines SPWL and PSWL and the word lines WLs.

In an embodiment, the operation circuits 120 to 140 may apply the erase voltage Verase to the common source line SL and the bit line BL, and apply the voltage Vpg for turning the pipe transistor off to the pipe gate PG of the pipe transistor.

In an embodiment, when the operation circuits 120 to 140 perform the erase operation on the memory cells included in group WLGroupS, the operation circuits 120 to 140 may apply the ground voltage (for example, 0 V) for the erase to the dummy word lines SPWL and PSWL and the word lines WLs. The dummy word line PSWL may be set to a floating state. The operation circuits 120 to 140 may set the dummy word lines DPWL and PDWL and the word lines WLd to a floating state, or apply the erase inhibit voltage Verase_inhibit to the dummy word lines DPWL and PDWL and the word lines WLd.

In an embodiment, the operation circuits 120 to 140 may apply the positive source select voltage Vssl lower than the erase voltage Verase by about 8 V to the source select line SSL so that the GIDL current required in the erase operation may be generated in the source select transistor. The positive drain select voltage Vdsl lower than the erase voltage Verase by about 5 V may be applied to the drain select line DSL, to improve the erase disturbance characteristics.

When the operation circuits 120 to 140 perform the erase operation on the memory cells included in group WLGroupD, the operation circuits 120 to 140 may apply the ground voltage (for example, 0 V) for the erase to the dummy word lines DPWL and PDWL and the word lines WLd. The dummy word line PDWL may be set to a floating state. The operation circuits 120 to 140 may set the dummy word lines SPWL and PSWL and the word lines WLs to a floating state, or apply the erase inhibit voltage Verase_inhibit to the dummy word lines SPWL and PSWL and the word lines WLs.

In an embodiment, the operation circuits 120 to 140 may apply the positive drain select voltage Vdsl lower than the erase voltage Verase by about 8 V to the drain select line DSL so that the GIDL current required in the erase operation may be generated in the drain select transistor. The positive source select voltage Vssl lower than the erase voltage Verase by about 5 V may be applied to the source select line SSL, to improve the erase disturbance characteristics.

The erase operation may be performed as described above with reference to FIGS. 3 to 8 and Tables 1 to 6, thereby performing the erase operation on smaller and more various unit bases than on the memory block basis.

Figure 9:
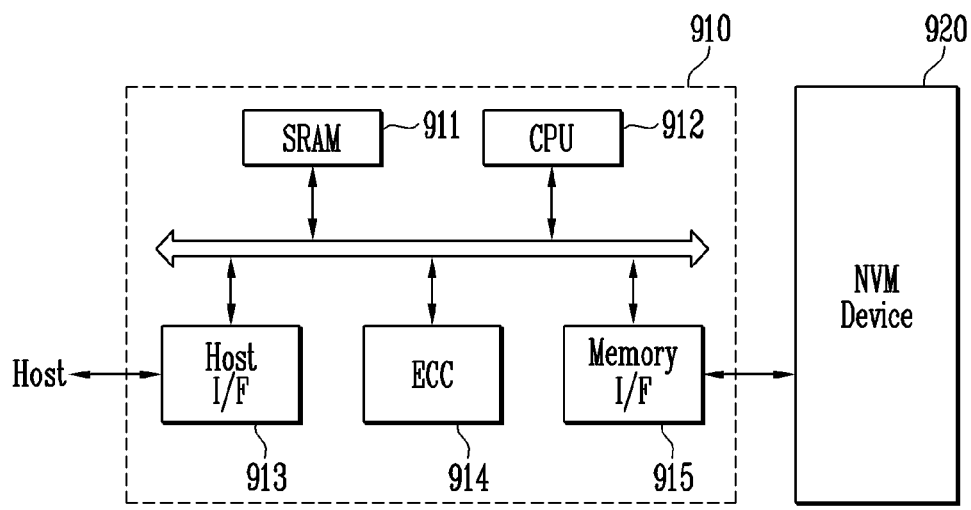
FIG. 9 is a block diagram illustrating a representation of an example of a memory system according to an embodiment.

FIG. 9 is a block diagram illustrating a representation of an example of a memory system according to an embodiment.

Referring to FIG. 9, a memory system 900 according to the various embodiments may include a nonvolatile memory (NVM) device 920 and a memory controller 910.

The NVM device 920 may correspond to the semiconductor device illustrated in FIG. 1, and the memory array and the operation circuits may be connected to the NVM device 920 as illustrated in FIG. 1. The memory controller 910 may be configured to control the NVM device 920. The NVM device 920 may be combined with the memory controller 910, and used for a memory card or a semiconductor disk device such as a solid state disk (SSD). An SRAM 911 is used as an operational memory of a central processing unit (CPU) 912. A host interface 913 includes a data exchange protocol of a host Host coupled to the memory system 900. An error correcting block (ECC) 914 detects and corrects an error in the data read from a cell area of the NVM device 920. A memory interface 915 interfaces with the NVM device 920 of the present invention. The CPU 912 performs overall control operations for exchange data of the memory controller 910.

Although not illustrated in FIG. 9, a person skilled in the art will understand that the memory system 900 according to the various embodiments may further include a ROM (not illustrated) configured to store code data for interfacing with the host Host, and/or the like. The NVM device 920 may be provided as a multi-chip package having a plurality of flash memory chips. The memory system 900 according to the various embodiments may be provided in a highly reliable storage medium having improved operation characteristics. For example, the flash memory device according to various embodiments may be included in a memory system such as a semiconductor disk device (an SSD) which has been actively studied recently. In these examples, the memory controller 910 may be configured to communicate with the outside (for example, the host Host) through at least one of various interface protocols such as USB, MMC, PCI-E, SATA, PATA, SCSI, ESDI, IDE, etc.

Figure 10:
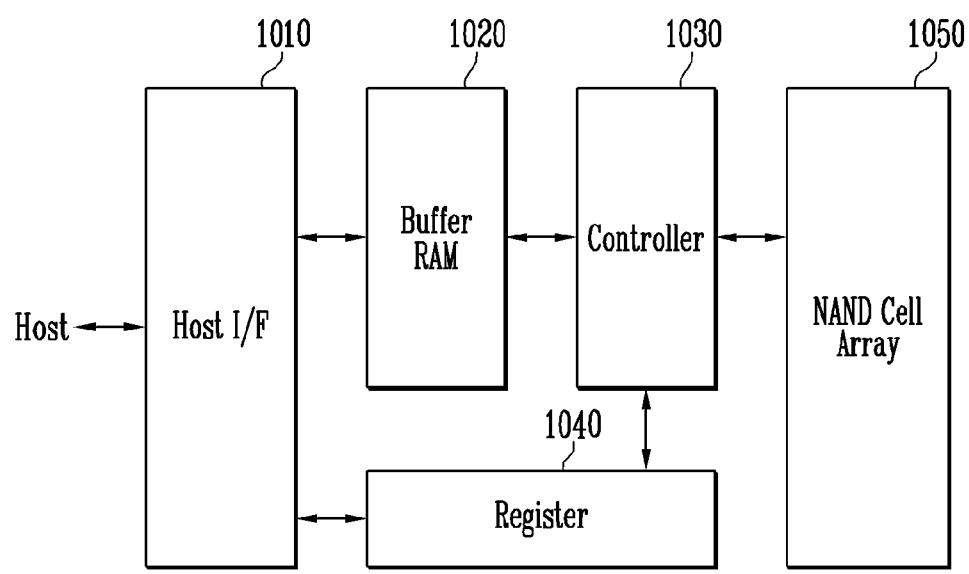
FIG. 10 is a block diagram illustrating a representation of an example of a fusion memory device or fusion memory system for performing a program operation according to the above-mentioned embodiments.

FIG. 10 is a block diagram illustrating a representation of an example of a fusion memory device or fusion memory system for performing a program operation according to the above-mentioned embodiments. For example, technical characteristics of the various embodiments may be applied to a OneNAND flash memory device 1000 as a fusion memory device.

The OneNAND flash memory device 1000 includes a host interface 1010 configured to exchange overall information with devices using different protocols, a buffer RAM 1020 including a code configured to drive the memory device or temporarily store data, a controller 1030 configured to control a read operation, a program operation, and all states in response to a control signal and a command provided from the outside, a register 1040 configured to store data such as the command, and an address, a configuration for defining a system operation environment inside the memory device, and/or the like, and a NAND flash cell array 1050 which includes an operation circuit having a nonvolatile memory cell and a page buffer. The OneNAND flash memory device 1000 programs data in a general method in response to a write request from the host Host.

Figure 11:
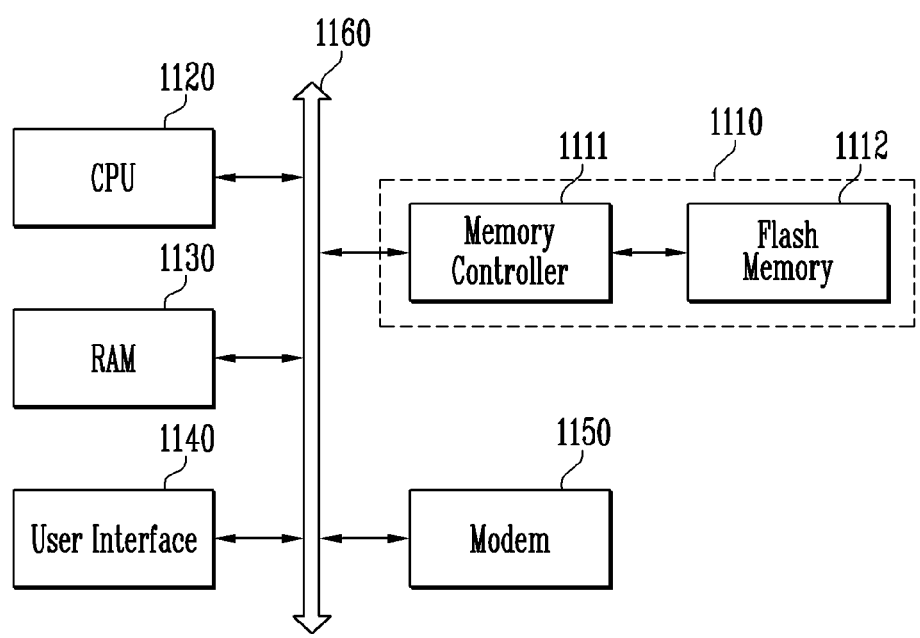
FIG. 11 is a block diagram illustrating a representation of an example of a computing system including a flash memory device according to an embodiment.

FIG. 11 is a block diagram illustrating a representation of an example of a computing system including a flash memory device 1112 according to an embodiment.

The computing system 1100 according to various embodiments may include a CPU 1120, a RAM 1130, a user interface 1140, a modem 1150 such as a baseband chipset, and a memory system 1110, which are electrically connected to a system bus 1160. When the computing system 1100 is a mobile device, a battery (not illustrated) configured to supply an operating voltage to the computing system 1100 may be additionally provided. Although not illustrated in FIG. 11, a person skilled in the art will understand that, in the computing system 1100 according to various embodiments, an application chipset, a camera image processor (CIS), a mobile DRAM, and/or the like may be further provided. The memory system 1110, for example, may be included in a solid state drive/disk (SSD) using the nonvolatile memory device described in FIG. 1 so as to store data. The memory system 1110 may also be provided in a fusion flash memory (for example, the OneNAND flash memory).

The semiconductor device according to the various embodiments may change the basis of the erase operation, and thus a lifetime and electrical characteristics of the semiconductor devices may be improved.

Various modifications can be made to the above-described examples of embodiments without departing from the spirit or scope of the application.

What is claimed is:

1. A semiconductor device comprising:
a memory block including memory strings, the memory strings connected to respective bit lines coupled to a substrate and commonly connected to a common source line coupled to the substrate; and
an operation circuit configured to perform an erase operation on memory cells included in the memory string,
wherein the bit lines are classified into a plurality of groups including a first group, a second group and a buffer group, based on the arranged order,
the buffer group includes buffer bit lines interposed between the first group and the second group, and
the operation circuit is configured to select the first group among the plurality of groups, apply an erase voltage to bit lines of the first group, set the common source line to a floating state for the erase operation, inhibit the erase operation on memory cells included in memory strings coupled to bit lines of the second group, and set the buffer bit lines of the buffer group to a floating state, or apply a positive voltage lower than the erase voltage to the buffer bit lines when performing the erase operation.

2. The semiconductor device of claim 1, wherein the operation circuit is configured to apply an erase inhibit voltage lower than the erase voltage to the bit lines of the second group.

3. The semiconductor device of claim 1,
wherein the bit lines are classified into the plurality of groups based on an arranged order, and
wherein the operation circuit is configured to perform an erase operation on the memory strings connected to bit lines of the first group and inhibit the erase operation of the memory strings connected to the bit lines of the second group.

4. The semiconductor device of claim 1, wherein the memory string includes a drain select transistor connected to the bit line, a source select transistor connected to the common source line, and the memory cells connected between the drain select transistor and the source select transistor, and
the operation circuit is configured to set the common source line and the source select transistor to a floating state, and apply a positive voltage for generating a gate-induced drain leakage (GIDL) current to the drain select transistor.

5. The semiconductor device of claim 1, wherein the memory string includes a pipe transistor formed on the substrate, and the operation circuit is configured to set the pipe transistor to an erase inhibit state in the erase operation.

6. The semiconductor device of claim 5, wherein a drain select voltage applied to the drain select transistor is lower than the erase voltage.

7. A semiconductor device comprising:
a memory block including memory strings substantially perpendicularly connected to a substrate between a bit line and a common source line coupled to the substrate, wherein the memory string includes a drain select transistor, memory cells, and a source select transistor connected between the bit line and the common source line; and
an operation circuit configured to perform an erase operation on the memory cells,
wherein a plurality of pairs of memory strings, each pair adjacent in a direction that is perpendicular to the bit line, connected to different bit lines and sharing gates of source select transistors are classified into one group,
wherein drain select transistors of each of the plurality of pairs of memory strings, each pair adjacent in a direction that is parallel to the bit line, are directly connected to the same bit line,
wherein the operation circuit is configured to perform an erase operation on memory cells included in memory strings of a selected group, inhibit erase operation on memory cells included in memory strings of a non-selected group and
wherein the gates of the source select transistors of the adjacent memory strings are connected to each other.

8. The semiconductor device of claim 7, wherein the operation circuit is configured to apply an erase voltage to the common source line, and set the bit line to a floating state or apply the erase voltage to the bit line for the erase operation.

9. The semiconductor device of claim 7, wherein the operation circuit is configured to apply a first positive voltage for generating a gate-induced drain leakage (GIDL) current to the gates of the source select transistors in the selected group, and
the operation circuit is configured to apply a second positive voltage lower than the first positive voltage to the gates of the source select transistors in a non-selected group, or set the gates of the source select transistors in the non-selected group to a floating state.

10. The semiconductor device of claim 7, wherein the operation circuit is configured to apply a first positive voltage for generating a GIDL current to gates of the drain select transistors in the selected group, and
the operation circuit is configured to apply a second positive voltage lower than the first positive voltage to gates of the drain select transistors in a non-selected group, or set the gates of the drain select transistors in the non-selected group to a floating state.

11. The semiconductor device of claim 7, wherein the memory string includes a pipe transistor connected between the memory cells and formed on the substrate, and the operation circuit is configured to apply a positive voltage for inhibiting an erase to a gate of the pipe transistor, or set the gate of the pipe transistor to a floating state in the erase operation.

12. A semiconductor device comprising:
a memory block including a plurality memory strings, the memory strings connected to respective bit lines coupled to a substrate and commonly connected to a common source line coupled to the substrate; and
an operation circuit configured to perform an erase operation on memory cells included in the memory strings,
wherein the bit lines are classified into a first group and a second group,
even bit lines of the bit lines are exclusively included in the first group, and odd bit lines of the bit lines are exclusively included in the second group, and
the operation circuit is configured to select the first group among the plurality of groups, apply an erase voltage to the even bit lines of the first group, set the common source line to a floating state for the erase operation, and inhibit the erase operation on memory cells included in memory strings coupled to the odd bit lines of the second group,
wherein the plurality of memory strings are connected to the even and odd bit lines, and the plurality of memory strings are grouped with the even and odd bit lines.

13. The semiconductor device of claim 12, wherein the operation circuit is configured to apply an erase inhibit voltage lower than the erase voltage to the odd bit lines of the second group.

14. The semiconductor device of claim 12,
wherein the bit lines are classified into the plurality of groups based on an arranged order, and
wherein the operation circuit is configured to perform an erase operation on the memory strings connected to the even bit lines of the first group and inhibit the erase operation of the memory strings connected to the odd bit lines of the second group.

15. The semiconductor device of claim 12, wherein each of the memory strings includes a drain select transistor connected to the bit line, a source select transistor connected to the common source line, and the memory cells connected between the drain select transistor and the source select transistor, and
the operation circuit is configured to set the common source line and the source select transistor to a floating state, and apply a positive voltage for generating a gate-induced drain leakage (GIDL) current to the drain select transistor.

16. The semiconductor device of claim 12, wherein each of the memory strings includes a pipe transistor formed on the substrate, and
the operation circuit is configured to set the pipe transistor to an erase inhibit state in the erase operation.

17. The semiconductor device of claim 16, wherein a drain select voltage applied to the drain select transistor is lower than the erase voltage.

* * * * *